US006995028B2

(12) United States Patent
Kawai

(10) Patent No.: US 6,995,028 B2
(45) Date of Patent: Feb. 7, 2006

(54) METHOD OF MANUFACTURING THERMAL TYPE FLOW SENSING ELEMENTS

(75) Inventor: Masahiro Kawai, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/944,390

(22) Filed: Sep. 20, 2004

(65) Prior Publication Data
US 2005/0250239 A1 Nov. 10, 2005

(30) Foreign Application Priority Data
May 10, 2004 (JP) ............... 2004-139533

(51) Int. Cl.
*H01L 21/66* (2006.01)
*H01L 21/00* (2006.01)
*H01L 21/301* (2006.01)

(52) U.S. Cl. ................ 438/18; 438/17; 438/54; 438/460

(58) Field of Classification Search ............. 438/18
See application file for complete search history.

(56) References Cited

U.S. PATENT DOCUMENTS

| 3,849,872 | A | * | 11/1974 | Hubacher | 438/17 |
| 4,426,773 | A | * | 1/1984 | Hargis | 29/832 |
| 5,389,556 | A | * | 2/1995 | Rostoker et al. | 438/17 |
| 5,532,174 | A | * | 7/1996 | Corrigan | 438/18 |
| 6,133,054 | A | * | 10/2000 | Henson | 438/17 |
| 6,225,141 | B1 | * | 5/2001 | Wenner et al. | 438/54 |
| 6,314,807 | B1 | * | 11/2001 | Kawai et al. | 73/204.26 |
| 6,470,742 | B1 | * | 10/2002 | Yamakawa et al. | 73/204.26 |
| 6,557,411 | B1 | * | 5/2003 | Yamada et al. | 73/204.26 |
| 6,698,283 | B2 | * | 3/2004 | Wado et al. | 73/204.26 |
| 6,709,878 | B2 | * | 3/2004 | Akram et al. | 438/14 |
| 6,844,218 | B2 | * | 1/2005 | Potts | 438/110 |

FOREIGN PATENT DOCUMENTS

JP 10-206205 A 8/1998

* cited by examiner

*Primary Examiner*—Mary Wilczewski
*Assistant Examiner*—David Goodwin
(74) *Attorney, Agent, or Firm*—Sughrue Mion, PLLC

(57) ABSTRACT

A method of manufacturing thermal type flow sensing elements is provided which improves workability and reliability without increasing manufacturing costs. Each flow sensing element comprises two lead patterns that are connected to both ends of a heat generating resistance and two lead patterns that are connected to both ends of a temperature sensing resistance. The lead patterns connected to the ends of the heat generating resistance are both connected to dummy patterns in the vicinity of electrodes. As for the lead patterns connected to the ends of the temperature sensing resistance, either one of them is connected to the dummy pattern in the vicinity of the electrode. The dummy patterns are patterned so as to provide parallel connection of the heat generating resistances of a plurality of flow sensing elements formed on a substrate, through the lead patterns.

12 Claims, 10 Drawing Sheets

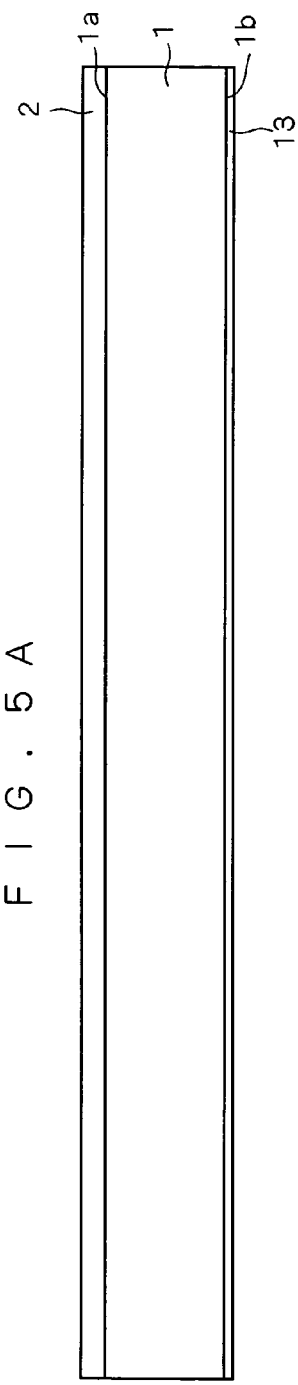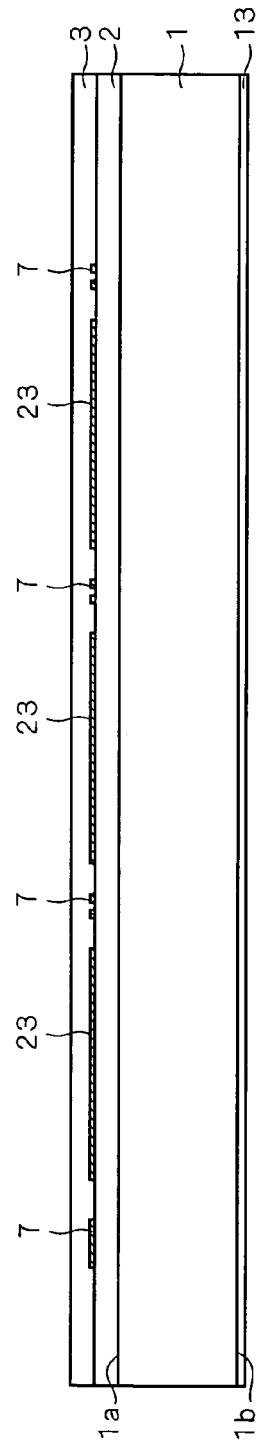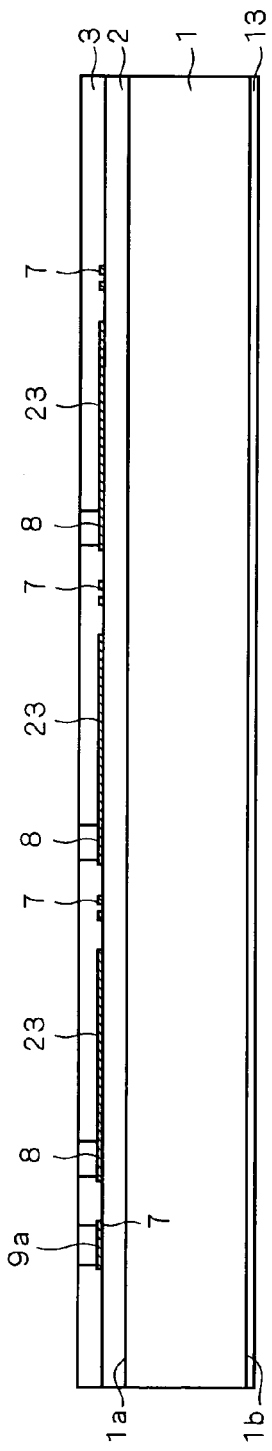

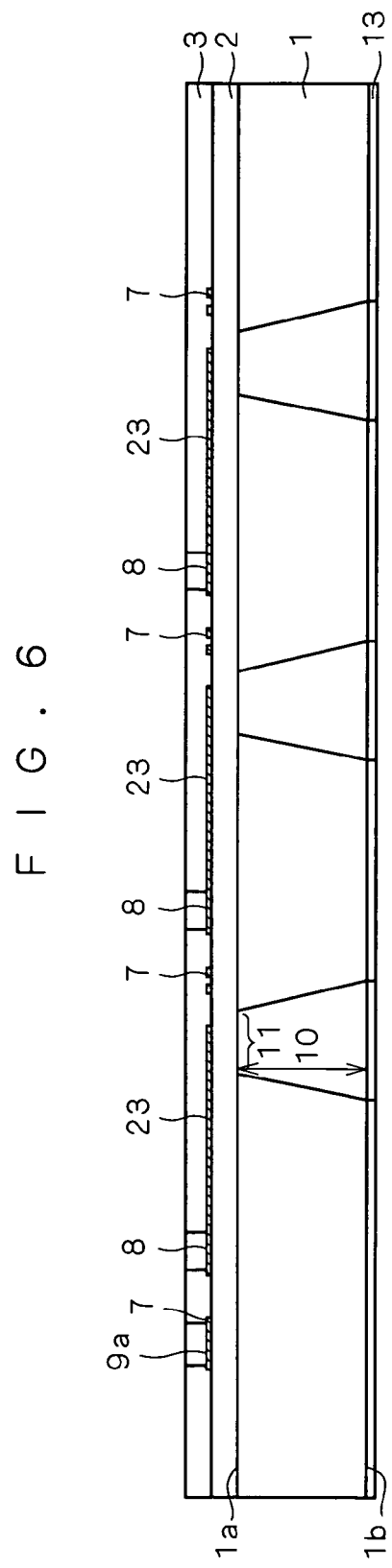

METHOD OF MANUFACTURING THERMAL TYPE FLOW SENSING ELEMENTS

BACKGROUND OF THE INVENTION

1. Field of the Invention

The present invention relates to flow sensing elements for a flow sensor that measures the volume of suction air and the like in an internal combustion engine, and especially to thermal type flow sensing elements each having a diaphragm structure where a thin-film sensor portion is formed on a substrate, and a method of manufacturing the same.

2. Description of the Background Art

In conventional methods of manufacturing thermal type flow sensing elements each having a diaphragm structure, after thin-film sensor portions are formed of a thermal resistance film on a substrate surface, regions of the substrate below the thin-film sensor portions are removed to form diaphragms. The substrate is then cut and separated into individual flow sensing elements. These separated flow sensing elements are incorporated into a flow sensor after processing.

For example, Japanese Patent Application Laid-open No. 10-206205 (1998) discloses one example of a method of manufacturing thermal type flow sensing elements each having a thin-film sensor portion formed on a substrate surface.

The thin-film sensor portion of each of the above flow sensing elements includes a heat generating resistance having a resistance value that varies with high heat generated by energization; thus, the characteristics of the heat generating resistance can change from the initial state. Accordingly, it is necessary to stabilize the characteristics by providing electrical connection between the flow sensing elements and the exterior and by energizing the flow sensing elements so as to previously bring their respective heat generating resistances to a predetermined temperature or more.

An example of the techniques for providing electrical connection as above described is a technique for bringing the electrodes of the flow sensing elements into direct contact with pins. This case, however, presents the problem of possible damage to the electrodes, thereby resulting in degraded reliability.

To avoid such degradation in reliability, there is a technique for supplying energization after assembling a flow sensor into a condition to readily establish connection with the exterior. In this case, however, an increase in the size of a structure leads to an increase in the size of facilities for energization, thereby resulting in a decrease in workability.

Further, in the processing of the above separated flow sensing elements, a protective film is formed on the thin-film sensor portions of a thermal resistance film. If this protective film has defects in coverage due to cracks, foreign material and the like, electrolysis may occur at these defects in coverage when the flow sensing elements are exposed to water. At this time, since changes in the resistance values cause variations in the characteristics from the initial state, the resistances may become open in the worst case. It is therefore necessary to check whether or not defects due to cracks, foreign material and the like extend to the thermal resistance film, but it is difficult to observe the flow sensing elements in sections. Hence, as for defects due to foreign material, manufacturing is controlled such that the flow sensing elements are directly observed from the surface side by eye or by a microscope, etc., for the size of foreign material, and if the size exceeds a predetermined value, the foreign material is judged to be a defect. However, depending on the shape of foreign material, even where the foreign material appears small from direct observation from the surface, it can actually be a large defect. Therefore, it is difficult to accurately detect all defects due to foreign material from direct observation from the surface side by eye or by a microscope, etc. The same can be said of defects due to cracks. Accordingly, inspection by direct observation from the surface has the problem of possible degradation in reliability.

To avoid such degradation in reliability, there is a technique for performing inspection by, instead of conducting direct observations, energizing the flow sensing elements with their bodies immersed in water and observing, by eye or by a microscope, etc., the generation of air bubbles due to electrolysis at defects in coverage. In this case, however, energization is required for each of a plurality of flow sensing elements, and thus, there are other problems of complicated manufacturing process steps and increased manufacturing costs.

SUMMARY OF THE INVENTION

An object of the present invention is to provide a method of manufacturing thermal type flow sensing elements with improved reliability.

The present invention is intended for a method of manufacturing thermal type flow sensing elements including an insulating support film formed on a substrate and a diaphragm formed by partially removing the substrate. This method includes the following steps (a) through (d). The step (a) is to form, on the support film, a plurality of flow sensor patterns which are formed of a thermal resistance film and each of which includes a heat generating resistor and a temperature sensing resistor. The step (b) is to form, on the support film, a dummy pattern which is formed of the thermal resistance film and which provides electrical connection of the plurality of flow sensor patterns. The step (c) is to perform a predetermined processing on the plurality of flow sensor patterns using the dummy pattern. The step (d) is to individually separate the plurality of flow sensor patterns to be released from connection by the dummy pattern.

The plurality of flow sensor patterns formed on the substrate can be connected with each other through the dummy pattern. Thus, by using the dummy pattern for predetermined processing on the plurality of flow sensing patterns, damage to electrodes can be prevented, and consequently, reliability can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5A, 5B, 5C and 6 are cross-sectional views showing the process steps of manufacturing the flow sensing elements according to the first preferred embodiment;

DESCRIPTION OF THE PREFERRED EMBODIMENTS

Hereinbelow, preferred embodiments of the present invention are described with reference to drawings. In the following drawings, for convenience of illustration, the proportions of the illustrated members do not reflect actual dimensions.

FIRST PREFERRED EMBODIMENT

Figure 1:
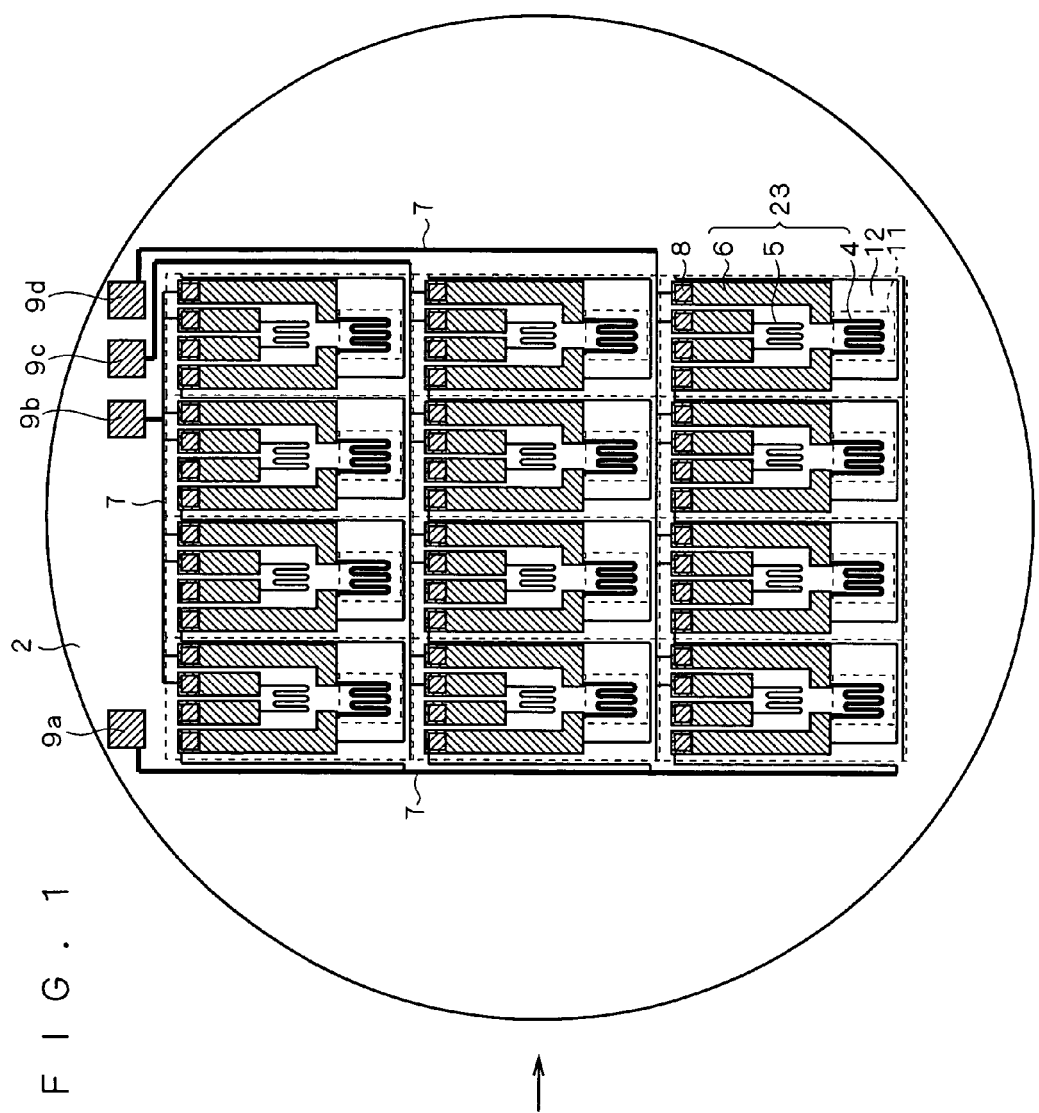
FIG. 1 is a top plan view showing the arrangement of flow sensing elements during the manufacturing process according to a first preferred embodiment.
Figure 2:
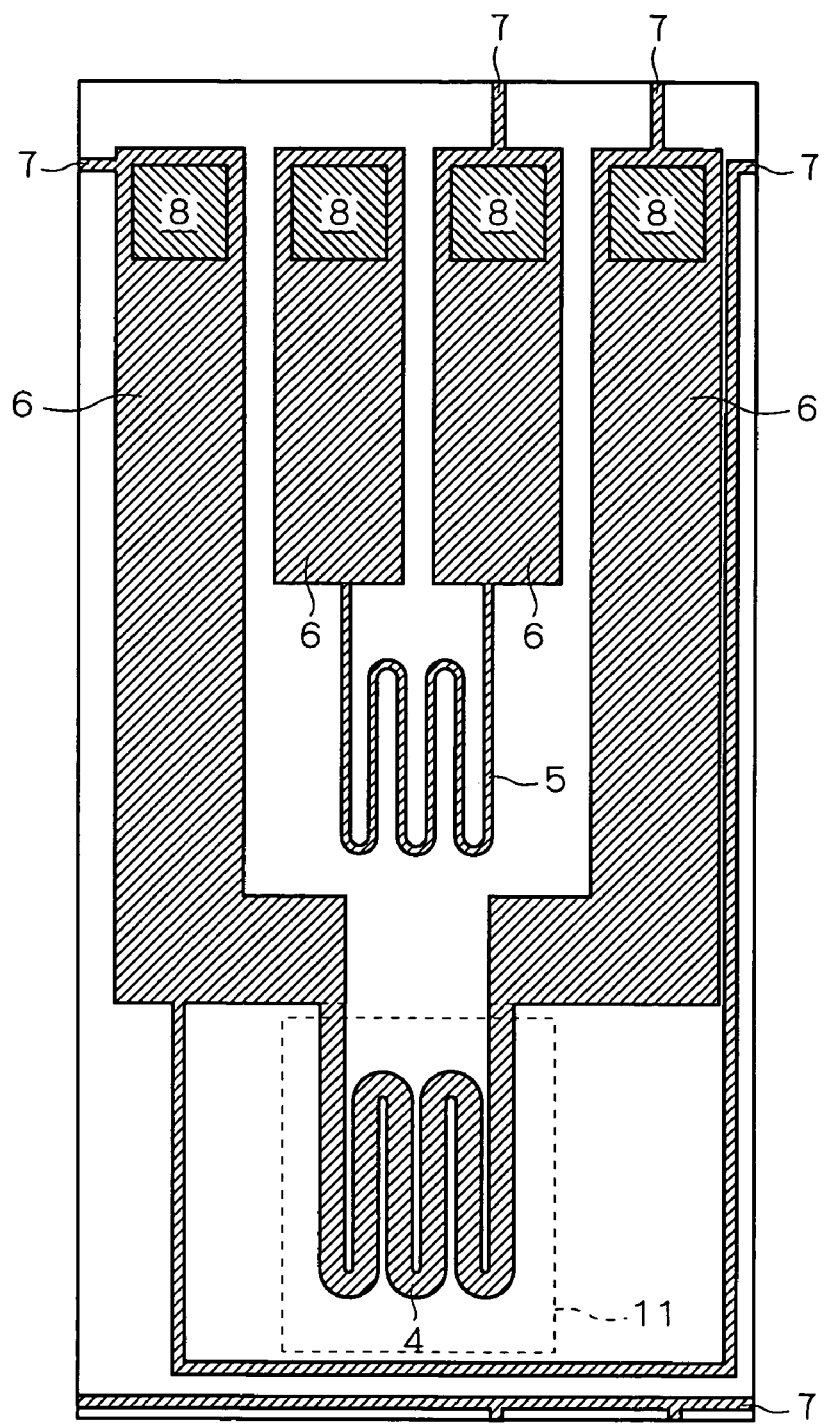
FIG. 2 is a top plan view showing the structure of a flow sensing element according to the first preferred embodiment.
Figure 3:
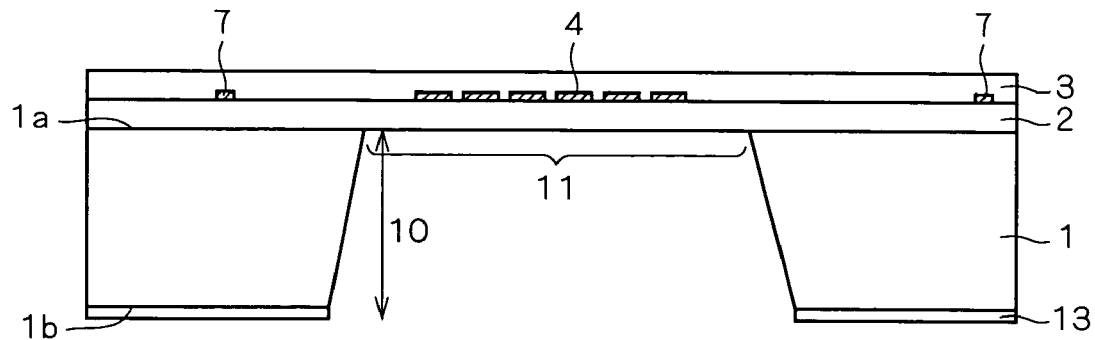
FIG. 3 is a cross-sectional view showing the structure of a flow sensing element according to the first preferred embodiment.

FIG. 1 is a top plan view showing the arrangement of thermal type flow sensing elements 12 on a substrate in the manufacturing process according to a first preferred embodiment. FIG. 2 is a top plan view showing a structure of one of the flow sensing elements 12 shown in FIG. 1. FIG. 3 is a cross-sectional view showing the structure of the flow sensing element 12 shown in FIG. 2. For convenience of illustration, a protective film 3 shown in FIG. 3 is not illustrated in FIGS. 1 and 2.

As shown in FIGS. 1 and 2, on a surface 1a side of a substrate 1 of silicon, an insulating support film 2 of silicon nitride is formed over the entire surface. On the support film 2, heat generating resistances (heat generating resistors) 4, temperature sensing resistances (temperature sensing resistors) 5, lead patterns 6 and dummy patterns 7 are formed of a thermal resistance film. This thermal resistance film is formed of a material having a temperature-dependent resistance value, such as platinum. Further, as shown in FIG. 3, an insulating protective film 3 of silicon nitride is formed on the support film 2 to cover the heat generating resistances 4, the temperature sensing resistances 5, the lead patterns 6 and the dummy patterns 7. Hereinbelow, a set of the heat generating resistance 4, the temperature sensing resistance 5 and the lead patterns 6 are also called a thin-film sensor portion 23. This thin-film sensor portion 23 serves as a flow sensor pattern according to the present invention.

As shown in FIGS. 1 to 3, the protective film 3 on the end portions of the lead patterns 6 is removed to expose the lead patterns 6 and thereby to form electrodes 8. Also, the protective film 3 on the end portions of the dummy patterns 7 is removed to expose the dummy patterns 7 and thereby to form dummy-pattern electrodes (electrodes for dummy patterns) 9a, 9b, 9c and 9d.

As shown in FIG. 3, a region of the substrate 1 that extends from a rear surface 1b side to the support film 2 is removed in the shape of a trapezoid in transverse cross section, thereby to form a cavity 10 under each of the heat generating resistances 4. Thereby, a thinly carved diaphragm 11 is formed as one piece with the substrate 1, the diaphragm 11 being constructed such that the substrate 1 holds the periphery of a film layer in which the heat generating resistance 4 is sandwiched between the support film 2 and the protective film 3.

As shown in FIG. 2, each of the flow sensing elements 12 comprises two lead patterns 6 that are connected to both ends of the heat generating resistance 4, and two lead patterns 6 that are connected to both ends of the temperature sensing resistance 5. The lead patterns 6 connected to the ends of the heat generating resistance 4 are both connected to the dummy patterns 7 in the vicinities of the electrodes 8. As for the lead patterns 6 connected to the ends of the temperature sensing resistance 5, either one of them is connected to the dummy pattern 7 in the vicinity of the electrode 8.

As shown in FIG. 1, there are a plurality of flow sensing elements 12 formed on the substrate 1. In the following description, the direction of the arrow in FIG. 1 is referred to as a lateral direction and the direction perpendicular to the arrow as a longitudinal direction. Further, a lateral arrangement of the flow sensing elements 12 is referred to as a row and a longitudinal arrangement thereof as a column. FIG. 1 illustrates twelve flow sensing elements in a matrix of three rows and four columns; however, the number of the flow sensing elements 12 is not restricted to twelve but may be any plural number.

As shown in FIG. 1, the dummy pattern 7 extending from the dummy-pattern electrode 9a is connected through the lead patterns 6 to one ends of the respective heat generating resistances 4 of the three flow sensing elements 12 arranged in the leftmost column. Each of the flow sensing elements 12 is connected at the one end of its heat generating resistance 4 to a laterally adjacent flow sensing element 12 through the lead patterns 6 and the dummy pattern 7.

Further, as shown in FIG. 1, the dummy pattern 7 extending from the dummy-pattern electrode 9b is connected through the lead patterns 6 to the other ends of the respective heat generating resistances 4 and one ends of the respective temperature sensing resistances 5, both of the four flow sensing elements 12 arranged in the top row. The dummy pattern 7 extending from the dummy-pattern electrode 9c is connected through the lead patterns 6 to the other ends of the respective heat generating resistances 4 and one ends of the respective temperature sensing resistances 5, both of the four flow sensing elements 12 arranged in the middle row. The dummy pattern 7 extending from the dummy-pattern electrode 9d is connected through the lead patterns 6 to the other ends of the respective heat generating resistances 4 and one ends of the respective temperature sensing resistances 5, both of the four flow sensing elements 12 arranged in the bottom row.

That is, the dummy patterns 7 are patterned to provide parallel connection of the heat generating resistances 4 of the plurality of flow sensing elements 12 on the substrate 1, through the lead patterns 6.

Next, a method of manufacturing the substrate 1, wherein a plurality of flow sensing elements 12 are arranged in the manner as above described, is described with reference to FIGS. 4 through 9.

Figure 4:
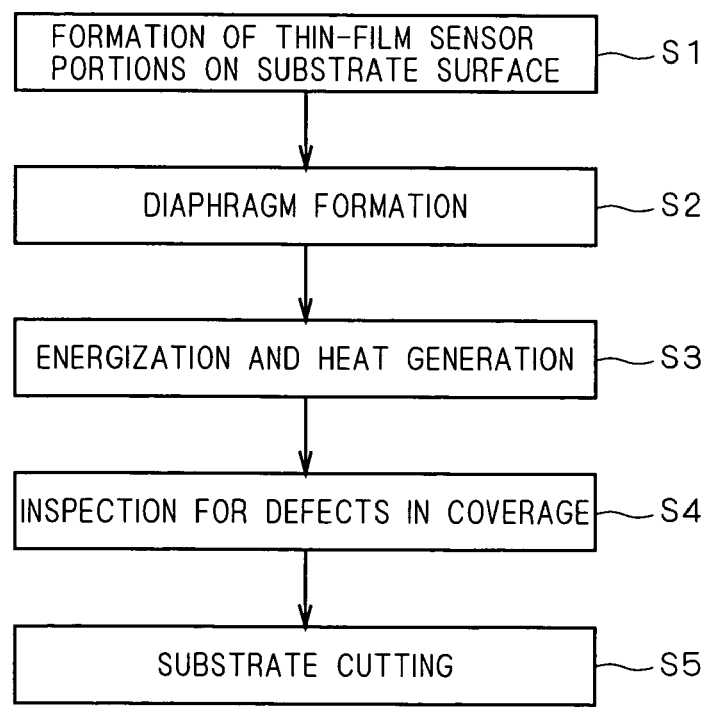
FIG. 4 is a flow chart showing the process steps of manufacturing the flow sensing elements according to the first preferred embodiment.

FIG. 4 is a flow chart showing the fundamental manufacturing process steps. Step S1 is forming the thin-film sensor portions 23 on the surface of the substrate 1. Step S2 is removing regions of the substrate 1 under the thin-film sensor portions 23 to form diaphragms 11. Step S3 is performing energization and heat generation processing for stabilization of the characteristics. Step S4 is conducting inspection for defects in coverage. Step S5 is cutting the substrate 1 into a plurality of flow sensing elements 12.

Now, a detailed description of the process steps of manufacturing the flow sensing elements 12 is given with reference to FIGS. 5a–5c and FIGS. 6 through 9.

First, step S1 is described.

FIGS. 5A, 5B and 5C are schematic views showing a detail of the manufacturing process step S1. FIGS. 5A–5C show the substrate 1 when viewed from the direction of the arrow of FIG. 1. It should be noted that members not in direct connection with the present description are not illustrated in FIGS. 5A–5C (the same applies to the following FIGS. 6 and 9 through 11).

In step S1, as shown in FIG. 5A, the substrate 1 of disc-type silicon having a (100) crystal orientation is prepared and a thermal oxide film 13 is formed over the entire rear surface 1b of the substrate 1. Here, the substrate 1 has a thickness of, for example, approximately 400 μm and the thermal oxide film 13 has a thickness of, for example, approximately 0.5 μm. Then, using techniques such as sputtering or CVD, a film of silicon nitride is deposited over the entire surface 1a of the substrate 1 to a thickness of approximately 1 μm, thereby to form the support film 2 on the substrate 1.

Then, as shown in FIG. 5B, after a film of platinum is deposited over the entire surface of the support film 2 to a thickness of approximately 0.2 μm using techniques such as vapor deposition or sputtering, this platinum film is patterned by techniques such as photolithography and wet etching (or dry etching) to form the dummy patterns 7 and the thin-film sensor portions 23 each including the heat generating resistance 4, the temperature sensing resistance 5 and the lead patterns 6. Then, using techniques such as sputtering or CVD, a film of silicon nitride is deposited over the entire surface of the support film 2 to a thickness of approximately 1 μm, thereby to form the protective film 3 on the support film 2.

Then, as shown in FIG. 5C, portions of the protective film 3 on the end portions of the lead patterns 6 and portions of the protective film 3 on the end portions of the dummy patterns 7 are removed by techniques such as photolithography and wet etching (or dry etching) to form the electrodes 8 and the dummy-pattern electrodes 9a–9d, respectively.

Next, step S2 is described.

FIG. 6 is a cross-sectional view showing a detail of the manufacturing process step S2.

In step S2, as shown in FIG. 6, a resist is applied onto the entire surface of the thermal oxide film 13 formed on the rear surface 1b of the substrate 1, and etching holes are formed in the resist by photolithographic techniques and the like. Thereafter, the alkaline etching, for example, is used to remove parts of the substrate 1 from the rear surface 1b side to the support film 2 and thereby to form the diaphragms 11, and then, the resist is removed. Examples of the etchants used in the above alkaline etching include KOH, tetraethylammonium hydroxide (TMAH) and NAOH.

Next, step S3 is described.

Figure 7:
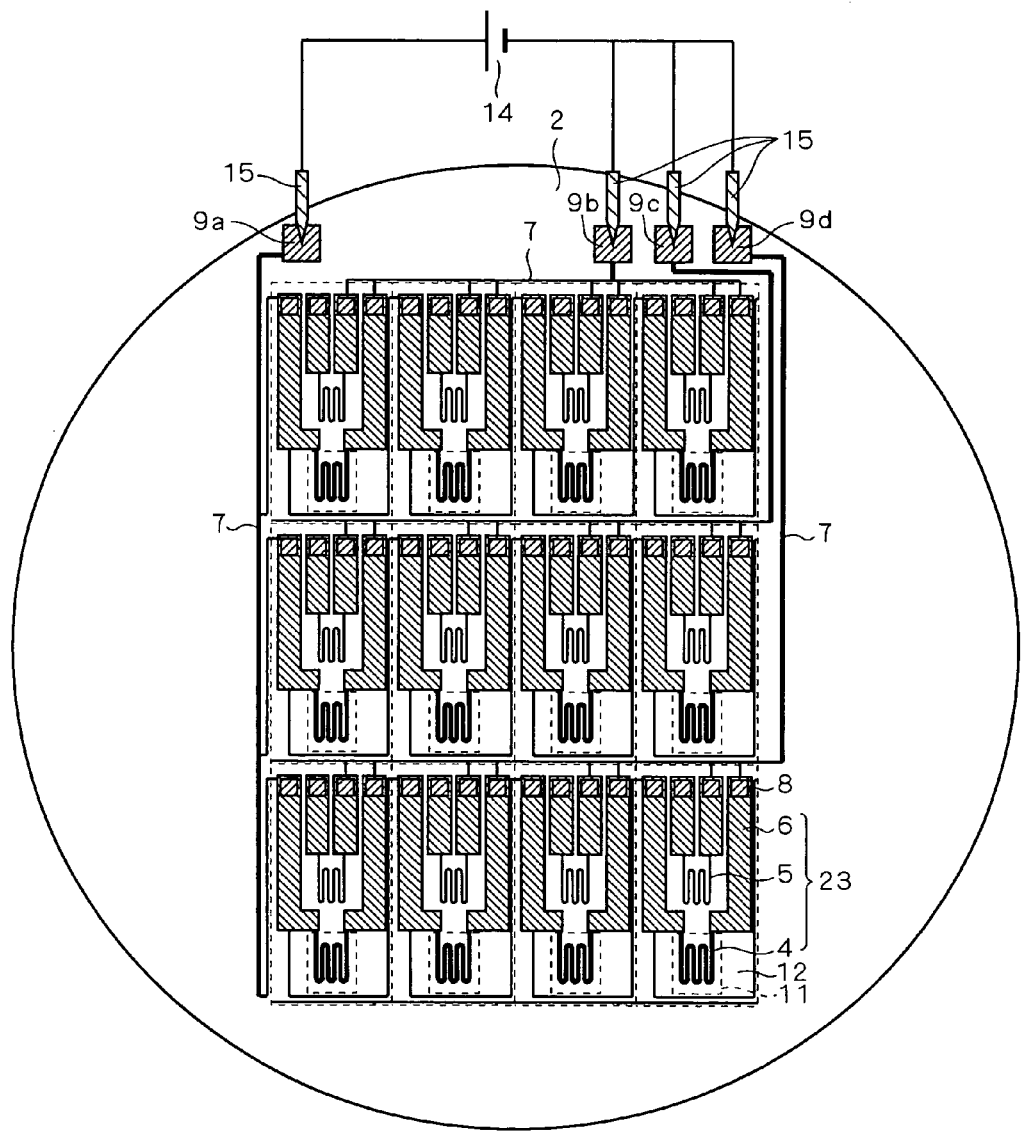
FIGS. 7 and 8 are top plan views showing the process steps of manufacturing the flow sensing elements according to the first preferred embodiment.

FIG. 7 is a schematic view showing equipment for performing energization and heat generation processing in step S3 for stabilization of the characteristics of the heat generating resistances 4.

In step S3, as shown in FIG. 7, conductive pins 15 are brought into contact with the dummy-pattern electrodes 9a–9d formed on the surface of the substrate 1 and a predetermined voltage (or current) is applied between the dummy-pattern electrode 9a and each of the dummy-pattern electrodes 9b–9d, thereby causing the heat generating resistances 4 to generate heat. This energization is supplied until fluctuations in the resistance values of the heat generating resistances 4 no longer occur. Alternatively, the energization may be supplied in a high-temperature atmosphere.

Next, step S4 is described.

Figure 8:
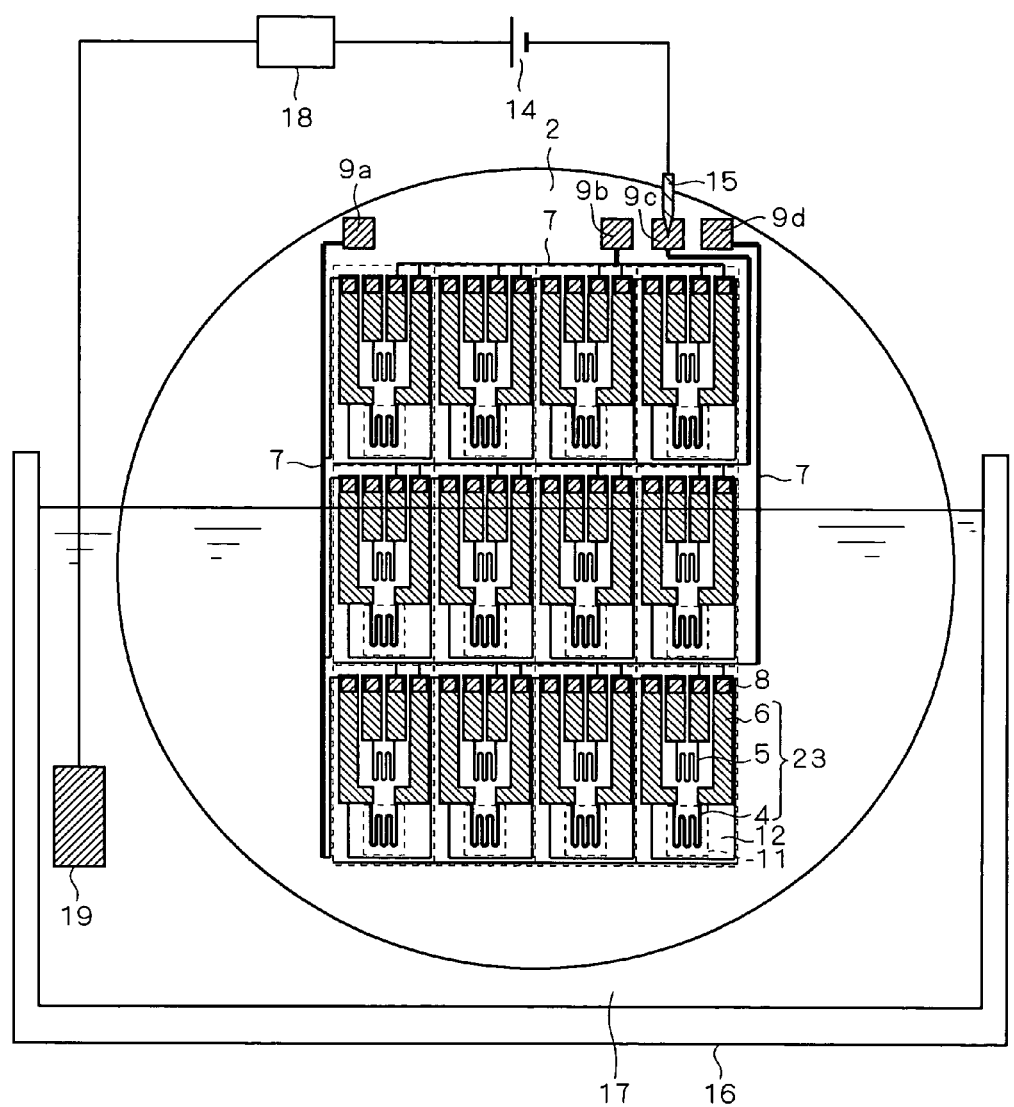

FIG. 8 is a schematic view showing inspection equipment for conducting inspection for defects in coverage in step S4.

In step S4, as shown in FIG. 8, a portion of the substrate 1 to be inspected is immersed in water 17 in a bath 16, and a pin 15 that is connected to the negative pole of a power supply 14 is sequentially brought into contact with the dummy-pattern electrodes 9b–9d in an ambient atmosphere (in FIG. 8 the pin 15 is in contact with the dummy-pattern electrode 9c). Here, a positive electrode 19 that is connected through a conducting monitor 18 to the positive pole of the power supply 14 is immersed in the water 17. With a predetermined voltage (or current) applied in this way to, for example, the dummy-pattern electrode 9c, the conducting monitor 18 checks for the occurrence of electrolysis and resultant continuity due to defects in coverage, which allows inspection of coverage of the protective film 3. While not shown in FIG. 8, there is another technique for conducting the inspection of coverage of the protective film 3 by, instead of using the conducting monitor 18, observing the surfaces of the flow sensing elements 12, being immersed in the water 17 for energization, by eye or by a microscope, etc., and thereby checking for the generation of air bubbles due to electrolysis. The substrate 1 is taken out of the bath 16 and dried after inspection.

Next, step S5 is described.

Figure 9:
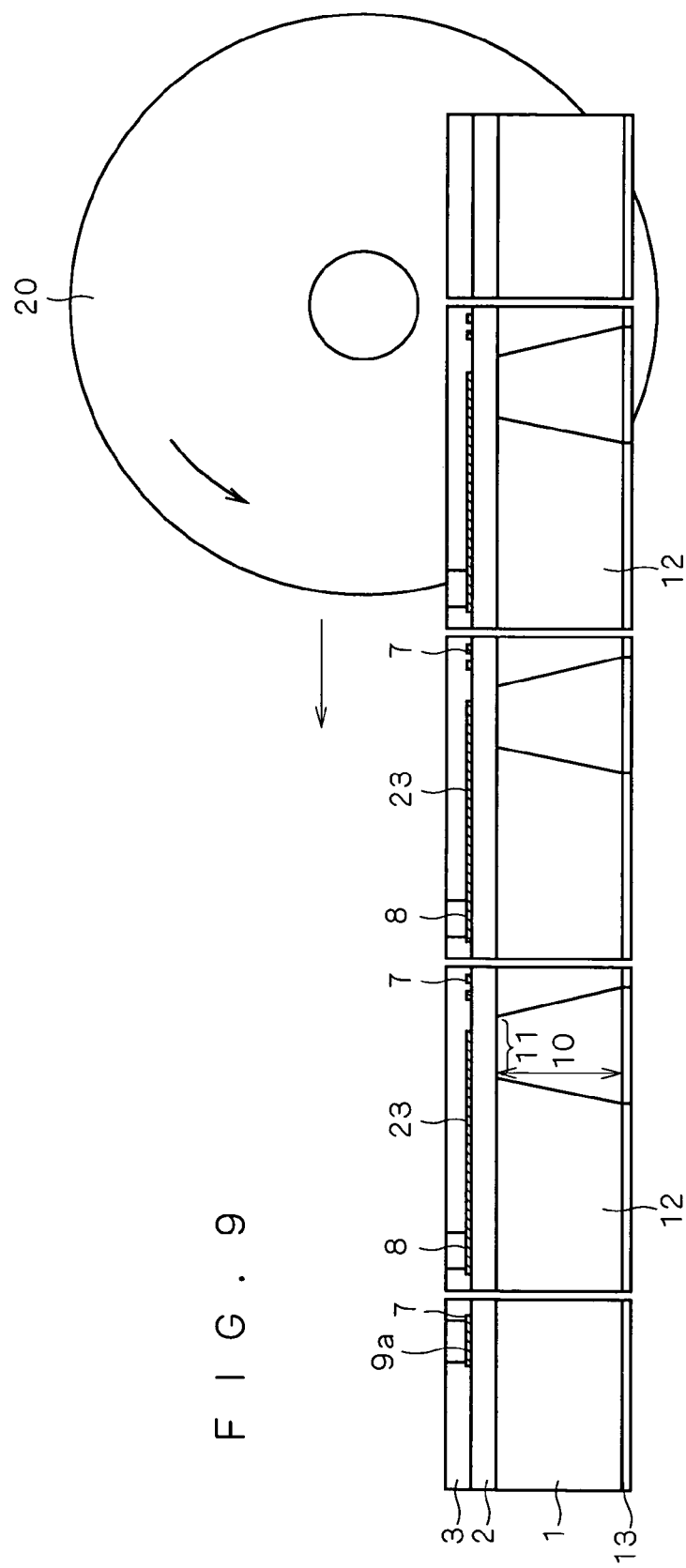
FIG. 9 is a cross-sectional view showing the process step of manufacturing the flow sensing elements according to the first preferred embodiment.

FIG. 9 is a cross-sectional view showing a detail of the manufacturing process step S5.

In step S5, as shown in FIG. 9, the substrate 1 is sectioned using, for example, a dicing saw 20. Thereby, the flow sensing elements 12 are separated, and at the same time, the dummy patterns 7 that provide parallel connection of the heat generating resistances 4 and the dummy patterns 7 that provide connection of the temperature sensing resistances 5 are cut off. Accordingly, the plurality of flow sensing elements 12 are released and become electrically open with each other.

Thus, in the method of manufacturing thermal type flow sensing elements according to this preferred embodiment, the plurality of thin-film sensor portions 23 which are formed on the substrate 1 and each of which includes the heat generating resistance 4, the temperature sensing resistances 5 and the lead patterns 6, are connected with each other through the dummy patterns 7. Then, using these dummy patterns 7, processing such as energization and inspection of coverage is performed on the plurality of flow sensing elements 12. This prevents damage to the electrodes 8, thereby improving reliability.

Also, the parallel connections of the plurality of heat generating resistances 4 allow simultaneous energization of the plurality of flow sensing elements 12 arranged on the substrate 1. Thus, energization is accomplished by simple facilities and the same voltage (or the same current), which results in improved workability and reduced manufacturing costs.

Further, the connections of the temperature sensing resistances 5, in addition to the heat generating resistances 4, to the dummy patterns 7 allow the whole of the thin-film sensor portions 23, each including the heat generating resistance 4, the temperature sensing resistance 5 and the lead patterns 6, to be inspected for coverage in the water 17. This results in improved reliability.

The dummy patterns 7 are connected to the lead patterns 6 in the vicinity of the electrodes 8. The flow sensing elements 12 are incorporated into a flow sensor after separated in step S5 and covered by a protective film. Since the electrodes 8 and their vicinities are covered with this protective film, the separating ends of the cut dummy patterns 7 are never exposed to a fluid such as water within the flow sensing elements 12 during actual use of a flow sensor. That is, the connection of the dummy patterns 7 with the lead patterns 6 in, for example, the vicinity of the electrodes 8 which are not exposed to a fluid during actual use can prevent deterioration due to corrosion and the like, thereby improving reliability.

Further, in step S1, the dummy patterns 7 and the thin-film sensor portions 23, each comprising the heat generating resistance 4, the temperature sensing resistance 5 and the lead patterns 6, are formed at the same time. This reduces the number of process steps and thus the manufacturing costs.

While, in the above description, the inspection of coverage of the protective film 3 is conducted in step S4 after energization of step 3, it is not necessarily conducted after energization but may be conducted at any time after the formation of the electrodes 9a–9d.

SECOND PREFERRED EMBODIMENT

In the method of manufacturing thermal type flow sensing elements according to the first preferred embodiment, the inspection for defects in coverage has been conducted by supplying energization, with the substrate 1 immersed in the water 17, and checking for the electrolysis of the water 17. Alternatively, instead of immersing the substrate 1 in the water 17, a conductive film may be formed on the protective film 3 and used for the inspection for defects in coverage.

Figure 10:
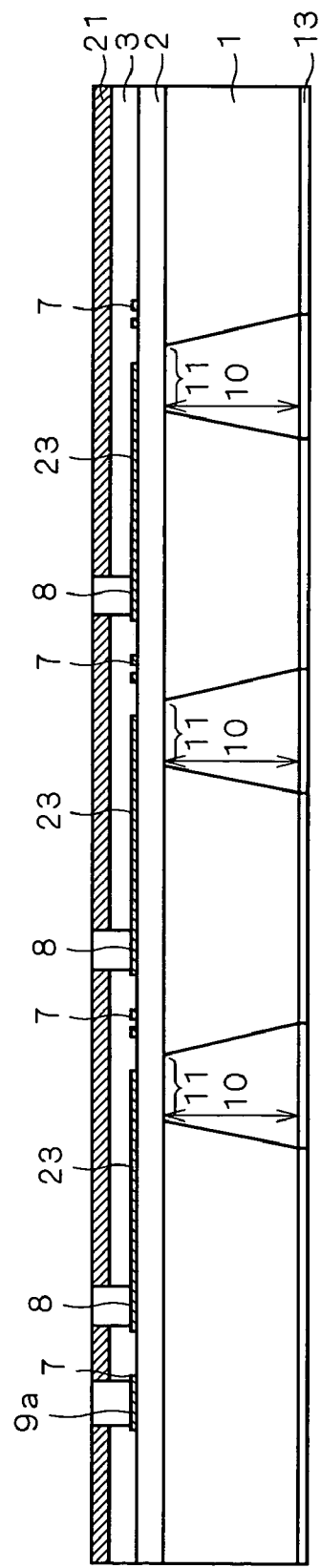
FIGS. 10 and 11 are cross-sectional views showing the process steps of manufacturing flow sensing elements according to a second preferred embodiment.

FIG. 10 is a cross-sectional view showing flow sensing elements according to a second preferred embodiment.

Referring to FIG. 10, a detail of the process steps of manufacturing flow sensing elements according to this preferred embodiment is described.

First, as in step S1 of the first preferred embodiment, the substrate 1 of disc-type silicon having a (100) crystal orientation is prepared and the thermal oxide film 13 is formed over the entire rear surface 1b of the substrate 1. Here, the substrate 1 has a thickness of, for example, approximately 400 $\mu$m and the thermal oxide film 13 has a thickness of, for example, approximately 0.5 $\mu$m. Then, using techniques such as sputtering or CVD, a film of silicon nitride is deposited over the entire surface 1a of the substrate 1 to a thickness of approximately 1 $\mu$m, thereby to form the support film 2 on the substrate 1.

Then, as in step S1 of the first preferred embodiment, after a film of platinum is deposited over the entire surface of the support film 2 to a thickness of approximately 0.2 $\mu$m using techniques such as vapor deposition or sputtering, this platinum film is patterned by techniques such as photolithography and wet etching (or dry etching) to form the dummy patterns 7 and the thin-film sensor portions 23 each including the heat generating resistance 4, the temperature sensing resistance 5 and the lead patterns 6. Then, using techniques such as sputtering or CVD, a film of silicon nitride is deposited over the entire surface of the support film 2 to a thickness of approximately 1 $\mu$m, thereby to form the protective film 3 on the support film 2.

Then, using techniques such as vapor deposition or sputtering, a film of platinum is deposited over the entire surface of the support film 2 to a thickness of, for example, approximately 0.2 $\mu$m, thereby to form a conductive film 21. Here, the material of the conductive film 21 is not restricted to platinum but may be any conductive material.

Then, portions of the protective film 3 and the conductive film 21 on the end portions of the lead patterns 6 are removed by techniques such as photolithography and wet etching (or dry etching) to form the electrodes 8. Using similar techniques, portions of the protective film 3 and the conductive film 21 on the end portions of the dummy patterns 7 are removed to form the dummy-pattern electrodes 9a–9d.

Then, as in step S2 of the first preferred embodiment, a resist is applied onto the entire surface of the thermal oxide film 13 formed on the rear surface 1b of the substrate 1, and etching holes are formed in the resist by photolithographic techniques and the like. Thereafter, the alkaline etching, for example, is used to remove parts of the substrate 1 from the rear surface 1b side to the support film 2 and thereby to form the diaphragms 11, and then, the resist is removed. As in step S2 of the first preferred embodiment, examples of the etchants used in the above alkaline etching include KOH, tetraethylammonium hydroxide (TMAH) and NAOH.

Then, as in step S3 of the first preferred embodiment, conductive pins 15 are brought into contact with the dummy-pattern electrodes 9a–9d formed on the surface of the substrate 1 and a predetermined voltage (or current) is applied between the dummy-pattern electrode 9a and each of the dummy-pattern electrodes 9b–9d, thereby causing the heat generating resistances 4 to generate heat. This energization is supplied until fluctuations in the resistance values of the heat generating resistances 4 no longer occur. Alternatively, the energization may be supplied in a high-temperature atmosphere.

Figure 11:
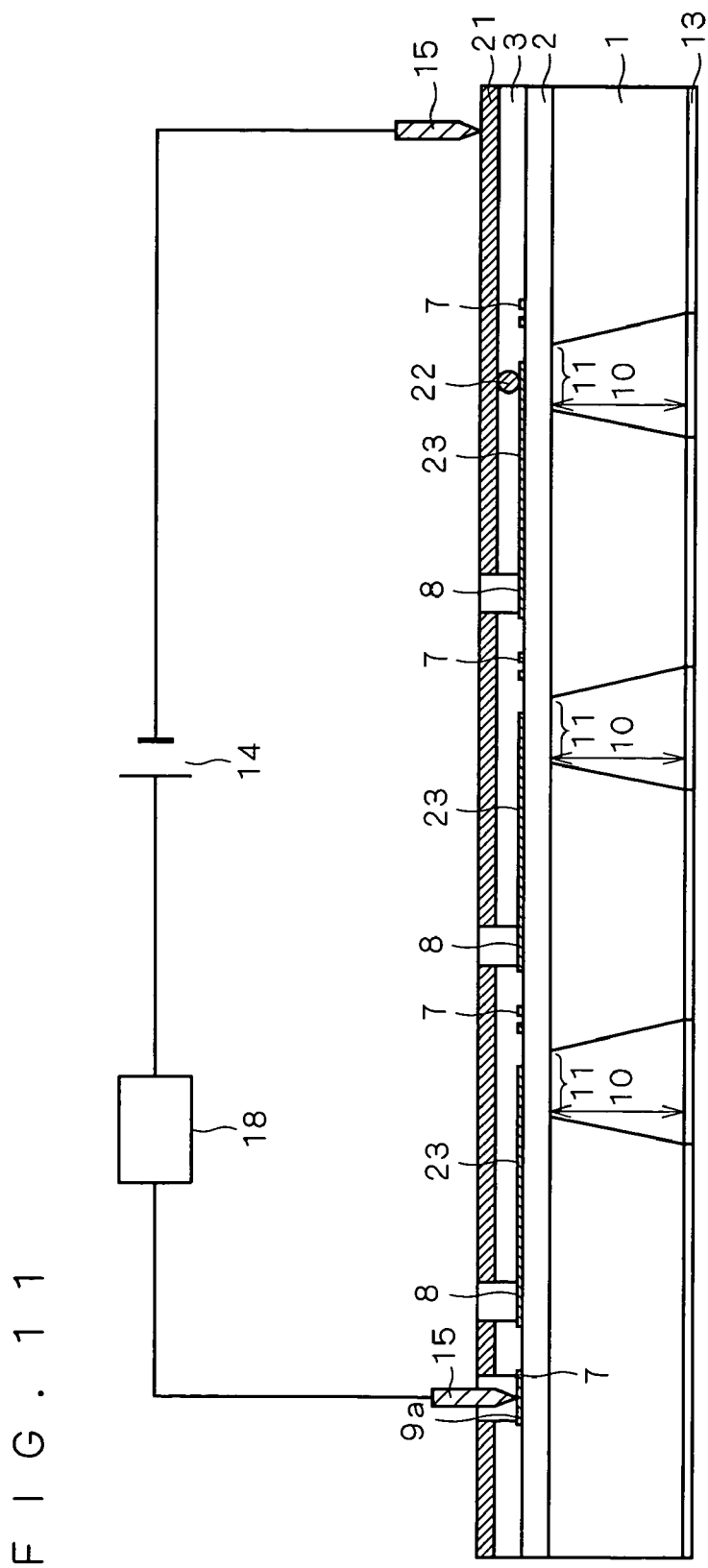

Then, inspection for defects in coverage of the protective film 3 is conducted using inspection equipment as shown in FIG. 11.

As shown in FIG. 11, a pin 15 that is connected to the negative pole of the power supply 14 is brought into contact with the conductive film 21 and at the same time, a pin 15 that is connected through the conducting monitor 18 to the positive pole of the power supply 14 is brought into contact with the dummy-pattern electrode 9a. With a predetermined voltage (or current) applied to the dummy-pattern electrode 9a, the conducting monitor 18 checks for the occurrence of continuity due to defects in coverage, which allows the inspection of coverage of the protective film 3. For example, when there exists conductive foreign material 22 between the thin-film sensor portion 23 and the conductive film 21 as shown in FIG. 11, the conducting monitor 18 will detect continuity through the foreign material 22, which allows the inspection of coverage of the protective film 3.

Then, as in step S5 of the first preferred embodiment, the substrate 1 is sectioned using, for example, the dicing saw 20. Thereby, the flow sensing elements 12 are separated, and at the same time, the dummy patterns 7 that provide parallel connection of the heat generating resistances 4 and the dummy patterns 7 that provide connection of the temperature sensing resistances 5 are cut off. Accordingly, the plurality of flow sensing elements 12 are released and become electrically open with each other.

Thus, in the method of manufacturing thermal type flow sensing elements according to this preferred embodiment, the use of the conductive film 21 formed on the protective film 3 allows inspection for defects in coverage without immersing the substrate 1 in the water 17. Accordingly, the inspection can be conducted with simple facilities and in an ambient atmosphere. This brings about, in addition to the effects of the first preferred embodiment, the effect of further improving workability. Also, the elimination of the need for the step of drying the substrate 1 has the effect of further reducing the manufacturing costs in addition to the effects of the first preferred embodiment.

However, since the above conductive film 21 can often have a high thermal conductivity, it is conceivable that, during actual use of the flow sensing elements 12 incorporated in a flow sensor, an increased heat conduction loss of the heat generating resistances 4 can result in reduced flow detection sensitivity. From this, the conductive film 21 may be removed after the inspection of coverage.

While, in the above description, the inspection of coverage of the protective film 3 is conducted after energization, it is not necessarily conducted after energization but may be conducted at any time after the formation of the electrodes 9a–9d. Or, it may be conducted after individual thermal sensing elements are separated.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing thermal type flow sensing elements each including an insulating support film formed on a substrate and a diaphragm formed by partially removing said substrate, said method comprising the steps of:
    (a) forming, on said support film, a plurality of flow sensor patterns which are formed of a thermal resistance film and each of which includes a heat generating resistor and a temperature sensing resistor;
    (b) forming, on said support film, a dummy pattern which is formed of said thermal resistance film and which provides electrical connection of said plurality of flow sensor patterns;
    (c) performing a predetermined processing on said plurality of flow sensor patterns using said dummy pattern; and
    (d) individually separating said plurality of flow sensor patterns to be released from connection by said dummy pattern.

2. The method as set forth in claim 1, further comprising the step of:
    forming a dummy-pattern electrode for electrical connection of said dummy pattern with an exterior.

3. The method as set forth in claim 1, wherein
    in said step (b), said dummy pattern is formed so as to electrically connect said heat generating resistors of adjacent ones of said flow sensor patterns in parallel with each other.

4. The method as set forth in claim 2, wherein
    in said step (b), said dummy pattern is formed so as to electrically connect said heat generating resistors of adjacent ones of said flow sensor patterns in parallel with each other.

5. The method as set forth in claim 1, further comprising the step of:
    after said step (d), covering separating ends of said dummy pattern with a protective film.

6. The method as set forth in claim 2, further comprising the step of:
    after said step (d), covering separating ends of said dummy pattern with a protective film.

7. The method as set forth in claim 1, wherein
    in said step (b), said dummy pattern is formed so as to electrically connect said temperature sensing resistors of adjacent ones of said flow sensor patterns.

8. The method as set forth in claim 2, wherein
    in said step (b), said dummy pattern is formed so as to electrically connect said temperature sensing resistors of adjacent ones of said flow sensor patterns.

9. The method as set forth in claim 1, further comprising the step of:
    forming a protective film on said flow sensor patterns and on said dummy pattern and further forming a conductive film on said protective film.

10. The method as set forth in claim 2, further comprising the step of:
    forming a protective film on said flow sensor patterns and on said dummy pattern and further forming a conductive film on said protective film.

11. The method as set forth in claim 1, wherein
    said steps (a) and (b) are performed in a single step.

12. The method as set forth in claim 2, wherein
    said steps (a) and (b) are performed in a single step.

* * * * *